United States Patent [19] [11] 4,284,961
Landau [45] Aug. 18, 1981

[54] DIGITAL POSITION TRANSDUCER INCLUDING VARIABLE TUNING ELEMENT OSCILLATOR

[75] Inventor: Darrell W. Landau, Garden Grove, Calif.

[73] Assignee: The United States of America as represented by the Secretary of the Air Force, Washington, D.C.

[21] Appl. No.: 76,893

[22] Filed: Sep. 19, 1979

[51] Int. Cl.³ .................. G01R 27/26; G03K 3/03; H03K 3/354
[52] U.S. Cl. .................. 331/65; 324/208; 331/111; 331/181; 331/DIG. 3
[58] Field of Search .................. 331/65, 108 D, 111, 331/181, DIG. 3; 324/207, 208

[56] References Cited

U.S. PATENT DOCUMENTS 3,756,081  9/1973  Young .................. 331/65 X
3,891,918  6/1975  Ellis .................... 331/181 X

OTHER PUBLICATIONS

RCA COS/MOS Integrated Circuits Manual, Technical Series CMS-271, pp. 89-94, 1972.

Primary Examiner—Siegfried H. Grimm
Attorney, Agent, or Firm—Donald J. Singer; William Stepanishen

[57] ABSTRACT

A digital position transducer apparatus utilizing a moveable slug-tuned inductor to measure the displacement or movement of a mechanical component. The value of the inductor controls an oscillator's output frequency which is converted to a digital word proportional to the displacement of a mechanical component.

8 Claims, 2 Drawing Figures

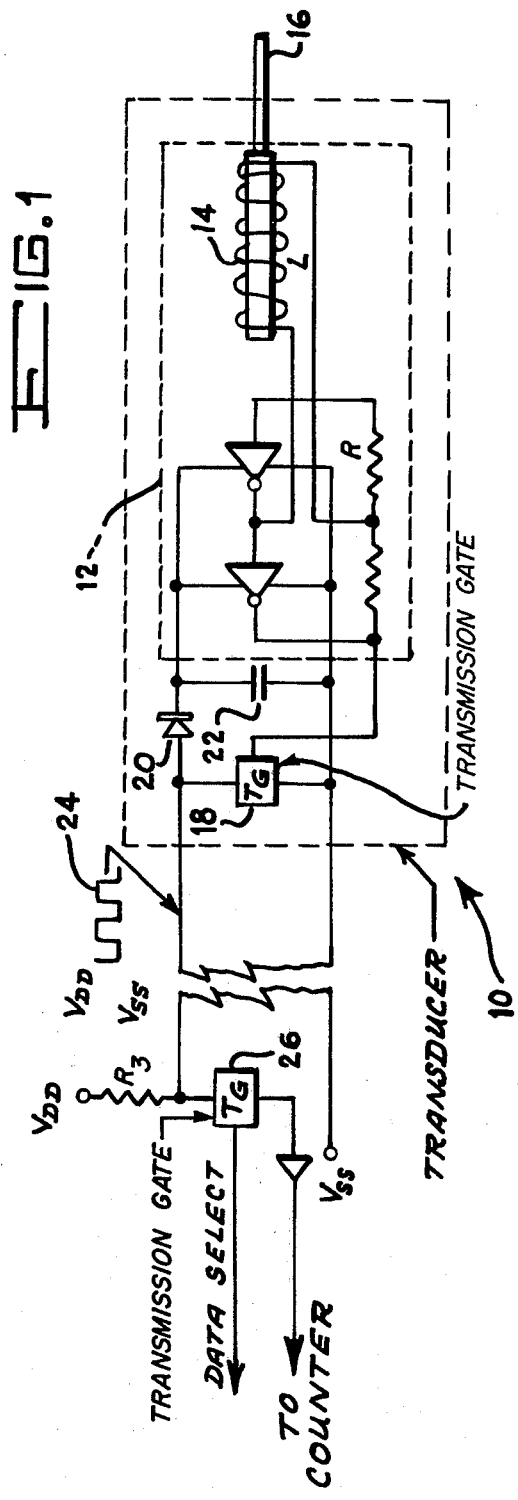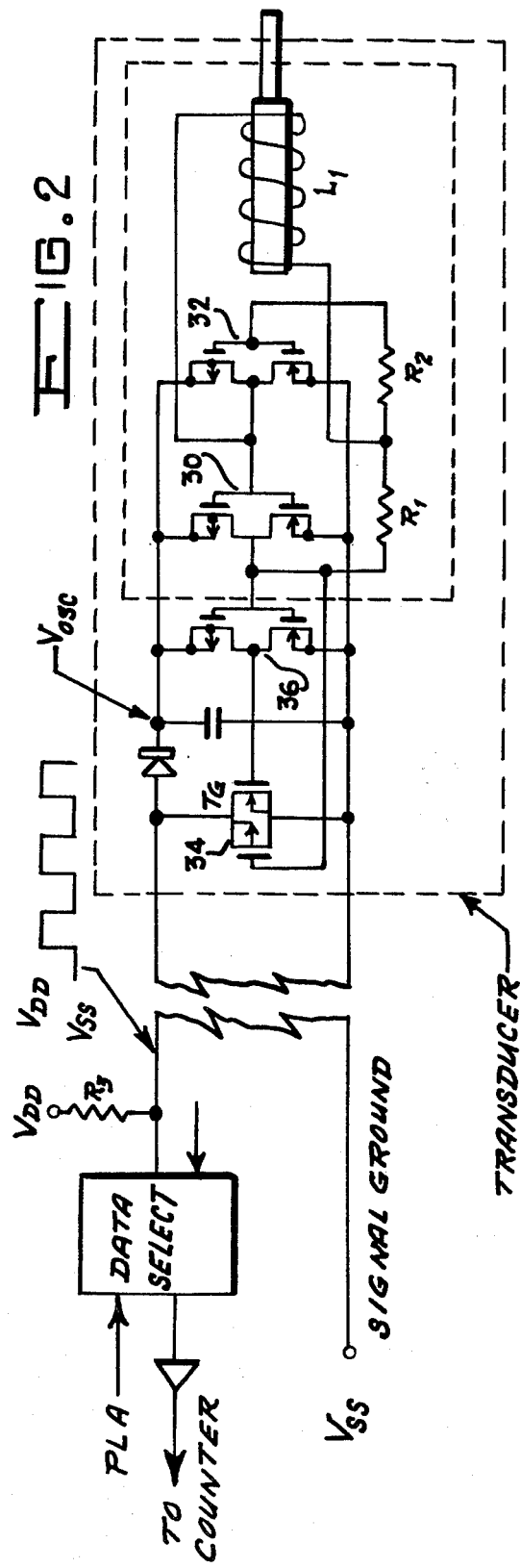

DIGITAL POSITION TRANSDUCER INCLUDING VARIABLE TUNING ELEMENT OSCILLATOR

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to a position transducer apparatus, and in particular to a digital transducer apparatus.

Aircraft and missile flight control systems utilize heavy duty high speed servo actuators to perform control functions. The electronics for these servo control loops have long been strictly analog. However, the outer loop flight control calculations have been performed with digital computers in recent times. Servo loop closure has continued to be analog for various reasons, some of which are that analog computation by dedicated elements at very high speed and prior guidance computers were too slow. It was a common belief that servo commands had to be analog. Most systems utilized servo feedback mechanisms having an analog output and digital shaft encoders were not competitive in a systems sense. Furthermore, digital electronics had been too costly and digital actuators too unwieldly in most system applications.

In the prior art, position transducers were utilized that were cylindrical in shape with an internal movable slug. They were mounted in the center of an actuator body and shaft, the transducer body was fastened to the actuator body while the transducer slug was fastened to actuator shaft. This packaging was very nearly ideal.

The present transducers are wired as a transformer with a primary excitation winding and two secondary windings which buck each other and are connected in series. The internal slug equally flux couples the opposing secondary windings at center or null. One or the other secondary winding dominates depending upon the direction and amount the internal slug is moved. The resultant output changes phase as the slug crosses center and increases amplitude proportionally as the slug extends. The transducer output is demodulated to a DC voltage proportional to the stroke which is used directly with analog electronics. If used with digital electronics the proportional (analog) DC voltage must be A to D converted prior to use.

Digital encoder methods utilizing shaft encoders have been tried in various applications. However, in most all flight control servo applications, the shaft encoders must provide absolute value as compared to incremental value and therefore require a Grey code readout with Grey code semiconductor decoding. A further problem is the difficulty of packaging and the many wire outputs. The wire problem can be solved, at a price if a nearby data bus electronics is available. However, in a hardwired system the number of wires create severe limitations. In addition, the making of a linear encoder is more difficult than a rotary one and packaging it inside an actuator with an opaque fluid at 3000 psi further compounds the difficulty. The present invention provides a viable alternative.

SUMMARY OF THE INVENTION

The present invention utilizes the frequency of a simple semiconductor oscillator whose output frequency is varied by a change in capacitance or inductance. The transducer apparatus is packaged similar to present position transducers except that it contains a single coil with a movable flux coupling slug. The oscillator frequency would vary as a function of slug position which is mechanically linked to the component under study. The oscillator output frequency may be coupled to a digital data processor for signal processing. A plurality of digital position transducer apparatus outputs could be selected (by either analog or digital data selector logic elements) and gated to a counter. The counter would convert the frequency as a function of position to a binary number VS position.

It is one object of the present invention, therefore to provide an improved digital position transducer apparatus.

It is another object of the invention to provide an improved position transducer apparatus providing an output frequency which is proportional to a measured distance.

It is yet another object of the invention to provide an improved position transducer apparatus utilizing a digital representation of a measured distance as feedback in a servo control system.

These and other advantages, objects and features of the invention will become more apparent after considering the following description taken in conjunction with the illustrative embodiment in the accompanying drawings.

BRIEF DESCRIPTION OF THE DRAWINGS

FIG. 1 is a block diagram of the digital position transducer apparatus in accordance with the present invention; and FIG. 2 is a schematic diagram of the digital position transducer apparatus.

DESCRIPTION OF THE PREFERRED EMBODIMENT

Referring now to FIG. 1, there is shown a block diagram of the digital position transducer apparatus 10 which is comprised of an RL oscillator 12 with a slug-tuned variable inductor 14. A position indicating rod 16 is fixed to the slug portion of the variable inductor 14. The rod 16 may be attached to any member or article whose movement or position is to be monitored, in the usual manner of so affixing position transducers. The movement of the rod 16 controls the position of the slug within the inductor 14 and thereby affects the value of the inductor in the RL oscillator 12. The output frequency from the RL oscillator 12 is dependent upon the value of the resistor R and the inducator L. As the position of the rod 16 changes, the value of the inducator 14 changes and thus the output frequency changes to correspond with the position change of rod 16.

The oscillator 12 drives a transmission gate (TG), 18 which pulls down the logic level from voltage $V_{DD}$. When the transmission gate 18 is ON and the logic level is pulled up by resistor $R_3$. When the transmission gate 18 is OFF, the high logic level through diode 20 charges capacitor 22 which then sustains oscillator operation during the low logic half of the cycle. The output signal from the digital position transducer apparatus 10 is shown as a square wave 24 whose amplitude varies between the values $V_{DD}$ and $V_{SS}$. The output signal from the transducer 10 may be coupled to digital data processing unit (not shown) by transmission gate 26 upon receipt of data select signal as shown.

Turning now to FIG. 2, there is shown a schematic diagram of the digital position transducer wherein a pair of CMOS devices 30, 32 are arranged in combination with resistors $R_1$, $R_2$ and inducator $L_1$ to provide an R-L oscillator. It may be noted that the present invention may be implemented as well as with an R-C oscillator, however, for the present example the R-L oscillator will be described. The RCA COS/MOS Integrated Circuits Manual, Technical Series CMS-271, dated 1972 on pages 89-94, has examples of RC and RL oscillators of the type that may be utilized in the present invention. As may be noted in FIG. 2, the RL oscillator therein shown and as shown in the RCA CMOS Manual differ only in the placement of resistor $R_2$ and inductor $L_1$.

The output frequency from the oscillator is applied to transmission gate 34 which may be a CMOS device that is connected in parallel as shown. In addition, in order to more effectively drive transmission gate 34, a complementary drive unit 36 utilizing a CMOS device which is connected serially, receives the output frequency from the oscillator and applies the complement of the output frequency to the opposite gate of transmission gate 34. The output signal from the digital position transducer apparatus varies as before, between the values $V_{DD}$ and $V_{SS}$. In the present example, the following voltages and component values are utilized:

$V_{DD} \cong 10 \ V_{DC}$
$V_{OSC} \cong 8 \text{ to } 9 \ V_{DC}$
$V_{SS} = $ signal ground
$C \geq 0.01 \text{ uF}$
$R_1 \cong 10 \text{ K}$
$R_2 \cong 20 \text{ K}$
$R_3 \cong 1 \text{ K}$
$L \cong 0.015 \text{ henrys}$ The following equations which apply to the present oscillator are shown in the RCA CMOS Handbook:

$$T = t_1 + t_2 = -\frac{L}{R}\left[\ln\frac{V_{GS}}{V_{DD} + V_{GS}} + \ln\frac{V_{DD} - V_{GS}}{2V_{DD} - V_{GS}}\right]$$

@ $V_{GS} \cong .5V_{DD}$ $$T = -\frac{L}{R}\ln\left[\frac{.5V_{DD}}{V_{DD} + .5V_{DD}} + \ln\frac{V_{DD} - .5V_{DD}}{2V_{DD} - .5V_{DD}}\right] =$$
$$-\frac{L}{R}(\ln .333 + \ln .333)$$
$$T = -\frac{L}{R}(-1.099 - 1.099) = 2.198\frac{L}{R}$$
$$L = \frac{TR_1}{2.198} \ @ \ T = \frac{1}{f}, L = \frac{R_1}{2.198f}$$

Table 1 tabulates the relationship of the inductor $L_1$ which is required to provide the desired output frequency.

TABLE 1

| $R_1$ | f | L | Ratio |
|---|---|---|---|
| 10K | 250 KHz | $182 \times 10^{-4}$ henrys | $3L_1$ |
| 10K | 500 KHz | $90 \times 10^{-4}$ henrys | $1.5L_1$ |
| 10K | 750 KHz | $60 \times 10^{-4}$ henrys | $L_1$ |

Although the invention has been described with reference to a particular embodiment, it will be understood to those skilled in the art that the invention is capable of a variety of alternative embodiments within the spirit and scope of the appended claims.

What is claimed is:

1. A digital position transducer apparatus comprising in combination:
    an oscillator means with a variable tuning element to control the output frequency of said oscillator means, said tuning element being connected to and varied by a position element which responds to the displacement of a control element, said output frequency varying as a function of said position element's displacement,
    a transmission gate connected between a signal ground and a source voltage, said transmission gate receiving said output frequency from said oscillator means, said transmission gate being turned on and off respectively to provide a high logic level and a low logic level in response to said output frequency, said transmission gate providing an output signal which is substantially a square wave comprising high and low logic levels, said output signal having a frequency corresponding to said output frequency, and,
    a low logic level sustaining means connected between said source voltage and said oscillator means, said low logic level sustaining means maintaining a predetermined voltage level across said oscillator means during the time said transmission gate is turned on.

2. A digital position transducer apparatus as described in claim 1 further including a complementing means connected between the output of said oscillator and said transmission gate, said complementing means receiving said output frequency, said complementing means providing a complementary signal output which is the complement of said output frequency, said complementary signal output being applied to said transmission gate to reinforce the turn on and off of said transmission gate in response to said output frequency.

3. A digital position transducer apparatus as described in claim 1 wherein said oscillator means comprises a first and second semiconductor amplifier, said first amplifier having its output connected directly to the input of said second amplifier, said second amplifier having its output connected to the input of said first amplifier through a first and second resistor, said tuning element being connected between the output of said first amplifier and the junction of said first and second resistors.

4. A digital position transducer apparatus as described in claim 3 wherein said tuning element comprises an inductor.

5. A digital position transducer apparatus as described in claim 1 wherein said transmission gate comprises a dual CMOS device connected in parallel.

6. A digital position transducer apparatus as described in claim 1 wherein said complementing means comprises a dual CMOS device connected in series.

7. A digital position transducer apparatus as described in claim 1 wherein first and second amplifier each comprise a dual CMOS device connected in series.

8. A digital position transducer apparatus as described in claim 1 wherein said tuning element comprises an inductor.

* * * * *